(12) United States Patent
Ostermaier et al.

(10) Patent No.: US 10,304,923 B2
(45) Date of Patent: May 28, 2019

(54) METHOD OF FORMING A VERTICAL POTENTIAL SHORT IN A PERIPHERY REGION OF A III-NITRIDE STACK FOR PREVENTING LATERAL LEAKAGE

(71) Applicant: Infineon Technologies Austria AG, Villach (AT)

(72) Inventors: Clemens Ostermaier, Villach (AT); Gerhard Prechtl, St. Jakob i. Rosental (AT); Oliver Häberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/031,799

(22) Filed: Jul. 10, 2018

(65) Prior Publication Data

US 2018/0331175 A1    Nov. 15, 2018

Related U.S. Application Data

(62) Division of application No. 15/048,809, filed on Feb. 19, 2016, now Pat. No. 10,038,051.

(51) Int. Cl.
*H01L 29/06*    (2006.01)
*H01L 21/768*   (2006.01)
*H01L 29/778*   (2006.01)
*H01L 29/423*   (2006.01)
*H01L 29/20*    (2006.01)

(52) U.S. Cl.
CPC .... *H01L 29/0607* (2013.01); *H01L 21/76879* (2013.01); *H01L 29/7786* (2013.01); *H01L 29/0657* (2013.01); *H01L 29/2003* (2013.01); *H01L 29/423* (2013.01)

(58) Field of Classification Search
CPC .......... H01L 29/0607; H01L 21/76879; H01L 29/7786; H01L 29/0657; H01L 29/2003; H01L 29/423
See application file for complete search history.

(56) References Cited

U.S. PATENT DOCUMENTS

2003/0075215 A1    4/2003   Sharps et al.
2011/0140172 A1*   6/2011   Chu ..................... H01L 29/2003
                                                            257/194

(Continued)

FOREIGN PATENT DOCUMENTS

JP    2007073898 A    3/2007

*Primary Examiner* — Peter Bradford
(74) *Attorney, Agent, or Firm* — Murphy, Bilak & Homiller, PLLC

(57) ABSTRACT

A method of manufacturing a semiconductor die includes forming a semiconductor body on a substrate. The semiconductor body has a periphery which is devoid of active devices and terminates at an edge face of the semiconductor die. The semiconductor body includes a first III-nitride semiconductor layer and a plurality of second III-nitride semiconductor layers below the first III-nitride semiconductor layer. The method further includes forming an uninsulated connection structure which extends vertically in the periphery of the semiconductor body and provides a vertical leakage path for at least some of the second III-nitride semiconductor layers either to the substrate or to a metallization layer disposed above the semiconductor body, but not to both. Additional semiconductor die manufacturing methods are provided.

20 Claims, 18 Drawing Sheets

(56) References Cited

U.S. PATENT DOCUMENTS

| | | |
|---|---|---|
| 2013/0341682 A1 | 12/2013 | Umeda et al. |
| 2015/0060942 A1 | 3/2015 | Kume et al. |
| 2015/0144957 A1 | 5/2015 | Lu et al. |
| 2015/0243657 A1 | 8/2015 | Lin et al. |
| 2015/0372126 A1 | 12/2015 | Bunin et al. |
| 2016/0141354 A1* | 5/2016 | Curatola ............ H01L 29/0607 257/76 |
| 2016/0181202 A1 | 6/2016 | Gong et al. |

* cited by examiner

METHOD OF FORMING A VERTICAL POTENTIAL SHORT IN A PERIPHERY REGION OF A III-NITRIDE STACK FOR PREVENTING LATERAL LEAKAGE

TECHNICAL FIELD

The present application relates to III-V semiconductor dies, in particular to preventing lateral leakage in the periphery of III-V semiconductor dies.

BACKGROUND

GaN based semiconductors provide superior performance figure of merits compared to silicon based semiconductors due to outstanding material properties. Additionally, GaN based semiconductors are also very robust against oxidation and other chemicals. However, this robust aspect is not valid if high electric fields are applied on a GaN device within a humid environment. The combination of a high electric field and moisture leads to severe oxidation of the GaN or AlGaN surface layer, and therefore to destruction of the device. The reduction-oxidation (redox) reaction between an AlxGa1-xN surface layer and water is given by:

$$2Al_xGa_{1-x}N + 3H_2O = xAl_2O_3 + (1-x)Ga_2O_3 + N_2\uparrow + 3H_2\uparrow. \quad (1)$$

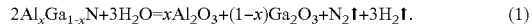

In the electrochemical cell, the gate metal acts as the cathode which provides electrons to the water at the interface. The corresponding reduction reaction for the water is given by:

$$2H_2O + 2e^- = H_2 + 2OH^-. \quad (2)$$

The electrons contribute to the total gate current. On the other hand, the AlxGa1-xN surface layer acts as the anode and is decomposed and subsequently anodically oxidized in the presence of holes and hydroxyl ions (OH—) as given by the following reactions:

$$2Al_xGa_{1-x}N + 6h^+ = 2xAl^{3+} + 2(1-x)Ga^{3+} + N_2\uparrow \quad (3)$$

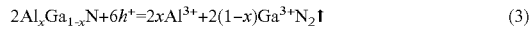

and $$2xAl^{3+} + 2(1-x)Ga^{3+} + 6OH^- = xAl_2O_3 + (1-x)Ga_2O_3 + 3H_2O. \quad (4)$$

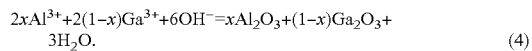

In summary, for the corrosion process to happen, it is necessary that: (1) holes are available at the top III-Nitride surface layer during high off-state drain bias conditions; and (2) water ions (e.g. OH and $H_3O^+$) from the ambient diffuse/permeate through the uppermost passivation layer and reach the III-Nitride surface layer. Under high applied fields, holes can be generated by either impact ionization or by inter-band tunneling (trap assisted).

With the high applied fields, holes can be generated by either impact ionization or by Inter-band tunnelling (trap assisted). Based on these reactions, the introduction of humidity into the GaN transistor cell field or at GaN regions with high fields must be avoided. Many GaN dies are fabricated from the same wafer. During the manufacturing process, the dies are physically separated from one another by sawing or laser dicing along singulation streets. The singulation streets divide adjacent dies and provide sufficient space to singulate the dies. During singulation, mechanical damage at the sidewall of each die often occurs e.g. cracking. To limit the damage caused by the singulation process on device performance, each die is typically surrounded by a seal ring to protect the dies from the physical damage. The seal ring can be floating or connected to ground. By grounding the seal ring, defined edge potentials are provided at the die sidewall.

The seal ring, which typically includes metal runners which surround the die periphery, are often in contact with the uppermost GaN layer and covered with a passivation which consists of a combination of oxides and nitrides. After singulation, the passivation is interrupted at the sawing location along the sidewall of each die. Humidity can enter into the exposed part of the oxide at the die sidewall. Oxides have low density and therefore do no function as a barrier against the diffusion of water and other ions.

In GaN-based device structures, an additional GaN feature exasperates the water/ion diffusion problem. During singulation, the GaN sidewall is open and not protected. Due to the layered GaN structure, low ohmic lateral paths can be formed within the stacked layers due to improper layer design or improper compensation. This is obvious due to the polarization jump in the layer stack sequence in that a 2DEG (two-dimensional electron gas) and a 2DHG (two-dimensional hole gas) must be formed. A similar mechanism is desired to form a 2DEG channel in the active region of a GaN HEMT device. If these layers are buried enough, these channels are not clearly visible in the lateral leakage behavior and also the breakdown of the device is not strongly affected. However, these laterally conductive layers, even if they are highly resistive, can lead to potential differences at the open GaN surface which results from the singulation process, even if the seal ring and the backside of the chip are grounded. By applying a high field at the drain contact of the device, a non-zero potential is realized at the GaN die edge. With this condition, water and other ions can react with the GaN and deteriorate the GaN layers leading to delamination issues in humid environments.

Furthermore, due to the layered GaN structure and as a result of improper layer design or improper compensation, low ohmic lateral paths can form within the stacked layers that have a lower resistance than expected or desired e.g. in the mega-ohm range instead of the giga-ohm range. Such low ohmic lateral paths can occur due to the polarization jump in the layer stack sequence, which is a similar mechanism for generating a 2DEG (two-dimensional electron gas) channel in a GaN HEMT device. If these layers are buried enough, the channels are not visible in the lateral leakage behavior and also the breakdown of the devices will not be strongly affected. However, these low ohmic lateral paths, even if they are highly resistive (e.g. in the mega-ohm range) can lead to potential differences at open GaN surfaces even if a seal ring and the backside of the die are grounded. By applying a high field at the drain contact of the device, a non-zero potential arises at the GaN die edge. Even nano-amps of leakage at the GaN die edge provide a large number of charges over time, which can cause undesirable chemical changes at the surface. As such, even mega-ohm lateral resistances are problematic in the die periphery.

Accordingly, there is a need for preventing lateral leakage in the periphery of III-V semiconductor dies.

SUMMARY

According to an embodiment of a semiconductor die, the semiconductor die comprises a substrate and a semiconductor body supported by the substrate and having a periphery which is devoid of active devices and terminates at an edge face of the semiconductor die. The semiconductor body comprises a first III-nitride semiconductor layer and a plurality of second III-nitride semiconductor layers below the first III-nitride semiconductor layer. The semiconductor die further comprises an uninsulated connection structure which extends vertically in the periphery of the semiconductor body and provides a vertical leakage path for at least some of the second III-nitride semiconductor layers to the substrate, to a metallization layer disposed above the substrate, or to both.

According to an embodiment of a method of manufacturing a semiconductor die, the method comprises: forming a semiconductor body on a substrate, the semiconductor body having a periphery which is devoid of active devices and terminates at an edge face of the semiconductor die, the semiconductor body comprising a first III-nitride semiconductor layer and a plurality of second III-nitride semiconductor layers below the first III-nitride semiconductor layer; and forming an uninsulated connection structure which extends vertically in the periphery of the semiconductor body and provides a vertical leakage path for at least some of the second III-nitride semiconductor layers to the substrate, to a metallization layer disposed above the substrate, or to both.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide an intentional vertical leakage path in the periphery of a III-nitride semiconductor die which has significantly lower resistance (e.g. less than mega ohm) than any of the expected lateral leakage paths which are present in the periphery along interfaces between adjacent III-nitride layers of the die. By providing such a low-resistance vertical leakage path, lateral leakage paths in the die periphery can be coupled to ground or close to ground. For example, by shorting the intentional vertical leakage path to the underlying substrate which may be at ground potential, the die edge also is at ground potential or close to ground potential. This way, little or no voltage difference arises along the die edge, ensuring no or only a few charges reach the die edge over time.

Figure 1:
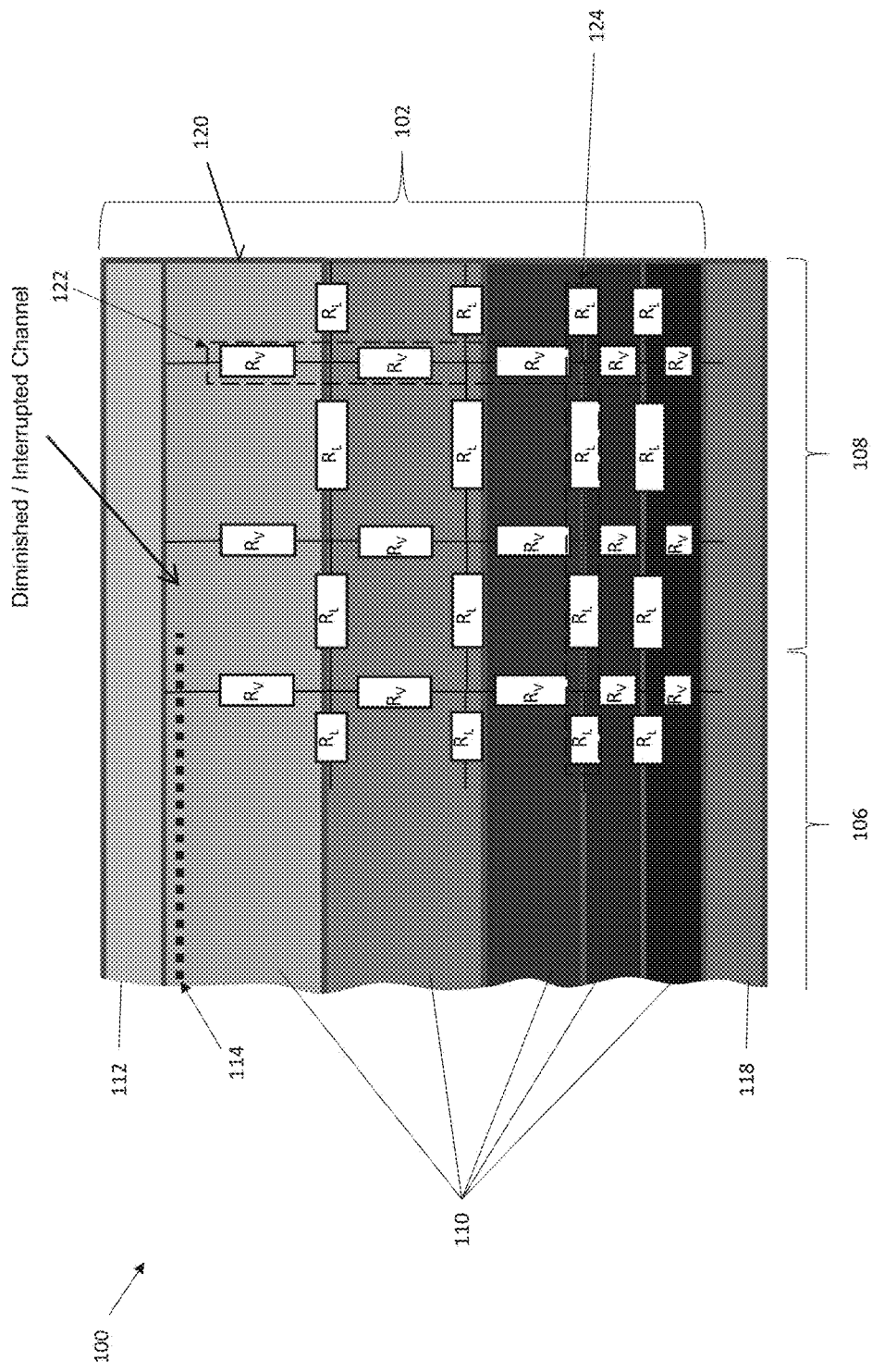
FIG. 1 illustrates a partial sectional view of an III-V semiconductor die having an intentional vertical leakage path in the periphery of the die.

FIG. 1 illustrates a partial sectional view of an embodiment of an III-V semiconductor die 100 having an III-V semiconductor body 102. A device is formed in an active region 106 of the III-V semiconductor body 102. The active region 106 is surrounded by a periphery 108 which is devoid of active devices. In the case of a III-nitride device, the semiconductor body 100 can include a plurality of III-nitride layers 110 and an III-nitride barrier layer 112 which forms a heterostructure with the uppermost III-nitride layer 110. In one embodiment, the III-V semiconductor die 100 is a GaN-based HEMT.

Specifically with regard to GaN technology, the presence of polarization charges and strain effects in a GaN-based heterostructure body 102 due to spontaneous and piezoelectric polarization yield a two-dimensional charge carrier gas 114 in the active region 106 of the heterostructure body 102 characterized by very high carrier density and carrier mobility. This two-dimensional charge carrier gas 114, such as a 2DEG (two-dimensional electron gas) or 2DHG (two-dimensional hole gas), forms the conductive channel of the device near the interface between the III-nitride barrier layer 112, e.g., a GaN alloy barrier such as AlGaN, InAlGaN, InAlN, etc. and the uppermost III-nitride layer 110, e.g., a GaN channel layer. A thin, e.g. 1-2 nm, AlN layer can be provided between the uppermost GaN layer 110 and the GaN alloy barrier layer 112 to minimize alloy scattering and enhance 2DEG mobility. The two-dimensional charge carrier gas channel 114 which arises along the interface between the GaN alloy barrier layer 112 and uppermost GaN layer 110 is at least diminished or even interrupted between the active region 106 and the periphery 108 of the die 100. For example, the GaN alloy barrier layer 112 and/or the uppermost GaN layer 110 can be intentionally doped in the periphery 108 of the die 100 to disrupt the conductive channel 114 in the periphery 108. Alternatively, the GaN alloy barrier layer 112 can be removed e.g. by etching in the periphery 108 of the semiconductor die 100 so as to interrupt the conductive channel 114 in the die periphery 108. In another example, the conductive channel 114 can be floating in the periphery 108 with the interruption being occurring somewhere between the active region 106 and the die edge 120.

In a broad sense, the semiconductor dies described herein can be formed from any binary, ternary or quaternary III-nitride compound semiconductor material where piezoelectric effects or a heterojunction is responsible for the device concept. The III-V semiconductor body 102 can be manufactured on a semiconductor substrate 118 such as a Si, SiC or sapphire substrate, on which a nucleation (seed) layer such as an AlN layer can be formed for providing thermal and lattice matching to the III-V semiconductor body 102. The III-V semiconductor body 102 may also have AlInN/AlN/GaN barrier/spacer/buffer layer structures. In general, the III-V semiconductor body 102 can be realized using any suitable III-V technology such as GaAs, GaN, etc.

The semiconductor body 102 is supported by the substrate 118 and has a periphery 108 which is devoid of active devices and terminates at an edge face 120 of the semiconductor die 100. In general, the semiconductor body 102 includes a first (barrier) III-nitride semiconductor layer (e.g. AlGaN) 112 and a plurality of second III-nitride semiconductor layers (e.g. GaN) 110 below the III-nitride barrier layer 112. An uninsulated connection structure 122 extends vertically in the periphery 108 of the semiconductor body 102 and provides a vertical leakage path for at least some of the III-nitride layers 110 to the substrate 118, to a metallization layer (not shown in FIG. 1) disposed above the semiconductor body 102, or to both. The uninsulated connection structure 122 has a resistivity of less than 1 mega-ohm*cm$^2$, which is lower than the resistivity of any of the expected lateral leakage paths which are present in the periphery 108 along the interfaces between adjacent ones of the III-nitride layers 110 of the III-nitride semiconductor body 102. The uninsulated connection structure 122 can extend completely through the periphery 108 of the semiconductor body 102 as shown in FIG. 1 so as to provide a vertical leakage path for each III-nitride layer 110 to both the substrate 118 and a metallization layer disposed above the semiconductor body 102. Alternatively, the uninsulated connection structure 122 can extend through only part of the periphery 108 so as to provide a vertical leakage path for the lower III-nitride layers 110 to the substrate 118 or to provide a vertical leakage path for the upper III-nitride layers 110 to a metallization layer disposed above the semiconductor body 102 e.g. in the case of a non-conductive substrate 118.

FIG. 1 shows a typical III-nitride stack with random layer sequences 110 overlaid with a resistive-network representing lateral ($R_L$) and vertical ($R_V$) resistance components of the different III-nitride layers 110. The stack of III-nitride layers 110 is designed to hold a relatively large voltage e.g. about 1000V with a leakage criterion of e.g. µA/mm$^2$ where some of the vertical resistances of the resistive-network being in the giga-ohm range while other ones of the vertical resistances may be lower e.g. in the mega-ohm range. Lateral resistances ($R_L$) of the resistive-network represent the lateral leakage paths present in the periphery 108 along the interfaces between adjacent ones of the III-nitride buffer layers 110. Each lateral resistance may have a similar resistance as the corresponding vertical resistance, or a lower resistance e.g. in the case of increased interface conduction where a 2DEG or 2DHG (two-dimensional hole gas) like channel arise due to a difference in polarization charges between two adjacent III-nitride layers 110. A difference in any of the resistances is mostly irrelevant with respect to detection, as only the largest resistance determines the vertical leakage and none of the lateral resistances are connected to an outside potential and therefore are floating. As such, assuming that the largest vertical resistance is 1 giga-ohm or greater, any resistance lower than 100 mega-ohm contributes less than 10% of the leakage current and therefore is basically undetectable.

FIG. 1 also shows the case of an undesirable enhanced lateral conduction pathway 124 formed along one of the interfaces between two adjacent ones of the III-nitride layers 110. The enhanced lateral conduction pathway 124 does not necessarily yield a good conducting channel, but could be in the mega-ohm range and therefore still result in a leaky lateral pathway having a high resistance. For example, the undesirable enhanced lateral conduction pathway 124 may yield picoamps of lateral leakage current which reaches the edge face 120 of the semiconductor die 100. In the case of a stack of III-nitride layers 110 which holds 600V or more, the undesirable enhanced lateral conduction pathway 124 may hold 200V which can be quasi-shorted to the edge face 120 of die 100 since the lateral pathway 124 is more conductive compared to the lateral pathways formed by the interfaces between the other adjacent III-nitride layers 110. As a result, there would be some voltage at the edge face 120 of the die 100. This lateral conduction pathway 124 can lead to an external potential e.g. of 100V or more. Despite any side wall passivation along the edge face 120 of the die 100, this leakage can lead to electro-chemical degradation of the layer stack or at least certain layers over time in case of insufficient passivation caused by defects, cracks, etc.

The uninsulated connection structure 122 which is illustrated in FIG. 1 as a series connection of vertical resistance components ($V_R$) extends vertically through the periphery 108 of the semiconductor body 102 and electrically connects each of the III-nitride layers 110 to the substrate 118, providing an intentional leakage path of a significantly lower resistivity than any of the expected lateral interface paths. In one embodiment, the uninsulated connection structure 122 has a resistivity of less than one mega-ohm*cm$^2$. The vertical leakage path realized by the uninsulated connection structure 122 can experience nanoamps of current over its lifetime, which is very low and therefore the uninsulated connection structure 122 can have relaxed design constraints. Any undesirable enhanced lateral conduction pathways 124 present in the periphery 108 of the die 100 which have a lateral resistivity in the mega-ohm*cm$^2$ range instead of the expected giga-ohm*cm$^2$ range are placed at ground or close to ground by the uninsulated connection structure 122, which is at or near ground potential.

Each lateral conduction pathway in the periphery 108 of the die 100 extends for several microns e.g. 10 or more microns. The uninsulated connection structure 122 extends through all or some of the III-nitride layers 110 and possibly the III-nitride barrier layer 112 (if present in the periphery), and therefore may have a height which is greater than the length of the lateral conduction pathways. For example, the uninsulated connection structure 122 can have a height of 1 micron, a few microns or even thicker if the uninsulated connection structure 122 extends vertically through the entire semiconductor body 102. As a result, the short to the substrate 118 and/or metallization layer disposed above the semiconductor body 102 realized by the uninsulated connection structure 122 is very good and a voltage potential of about 20V or less is expected at the edge face 120 of the die 100 even if an undesirable enhanced lateral conduction pathway 124 in the mega-ohm*cm$^2$ range is present in the stack of III-nitride layers 110. If the vertical resistance of the uninsulated connection structure 122 is at least 10 times less than the resistance of the leakiest lateral conduction pathway 124 in the die periphery 108, even the lowest-resistance lateral conduction pathway 124 will be effectively shorted and the edge face 120 of the die 100 therefore remains at ground or close to ground.

The uninsulated connection structure 122 causes lateral leakage current in the periphery 108 of the die 100 to be re-directed into the substrate 118 and/or the top metallization layer (not shown in FIG. 1), either of which can be at source or drain potential. While this vertical leakage contributes to additional off-state and/or on-state leakage, it is minor and therefore irrelevant. However, the intentional vertical leakage pathway realized by the uninsulated connection structure 122 does not contribute to any kind of electro-chemical degradation of the III-nitride semiconductor body 102.

Furthermore, any defective III-nitride layer 110 which includes an undesirable enhanced lateral conduction pathway 124 as shown in FIG. 1 will be shorted during initial testing. Without the uninsulated connection structure 122 and the resulting vertical short, a defective floating III-nitride layer 110 could pass the initial testing by being less relevant due to the other layers surrounding it, but eventually lead to accelerated degradation later on. The vertical short realized by the uninsulated connection structure 122, in combination with the detrimental lateral conduction pathway 124, should accelerate the degradation and therefore make it possible to be visible during initial device testing. This way, defective parts can be screened more effectively before entering the field. This is highly advantageous since the detrimental lateral conduction pathway 124 otherwise cannot be measured/monitored or detected using any standard device measurement.

Figure 2A:
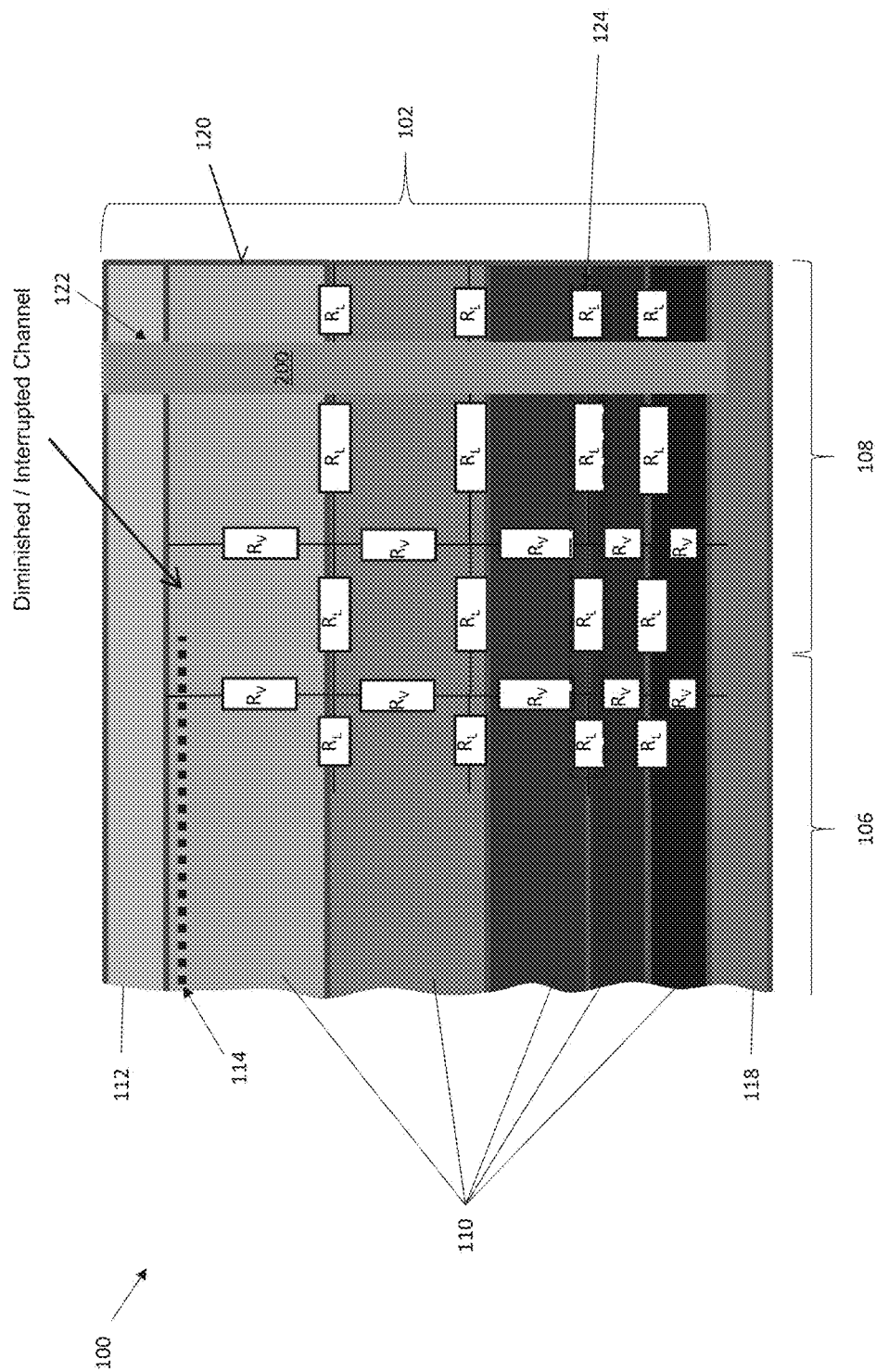
FIGS. 2A through 2C illustrate respective partial sectional views of the III-V semiconductor die of FIG. 1 according to different first embodiments of the intentional vertical leakage path.
Figure 2B:
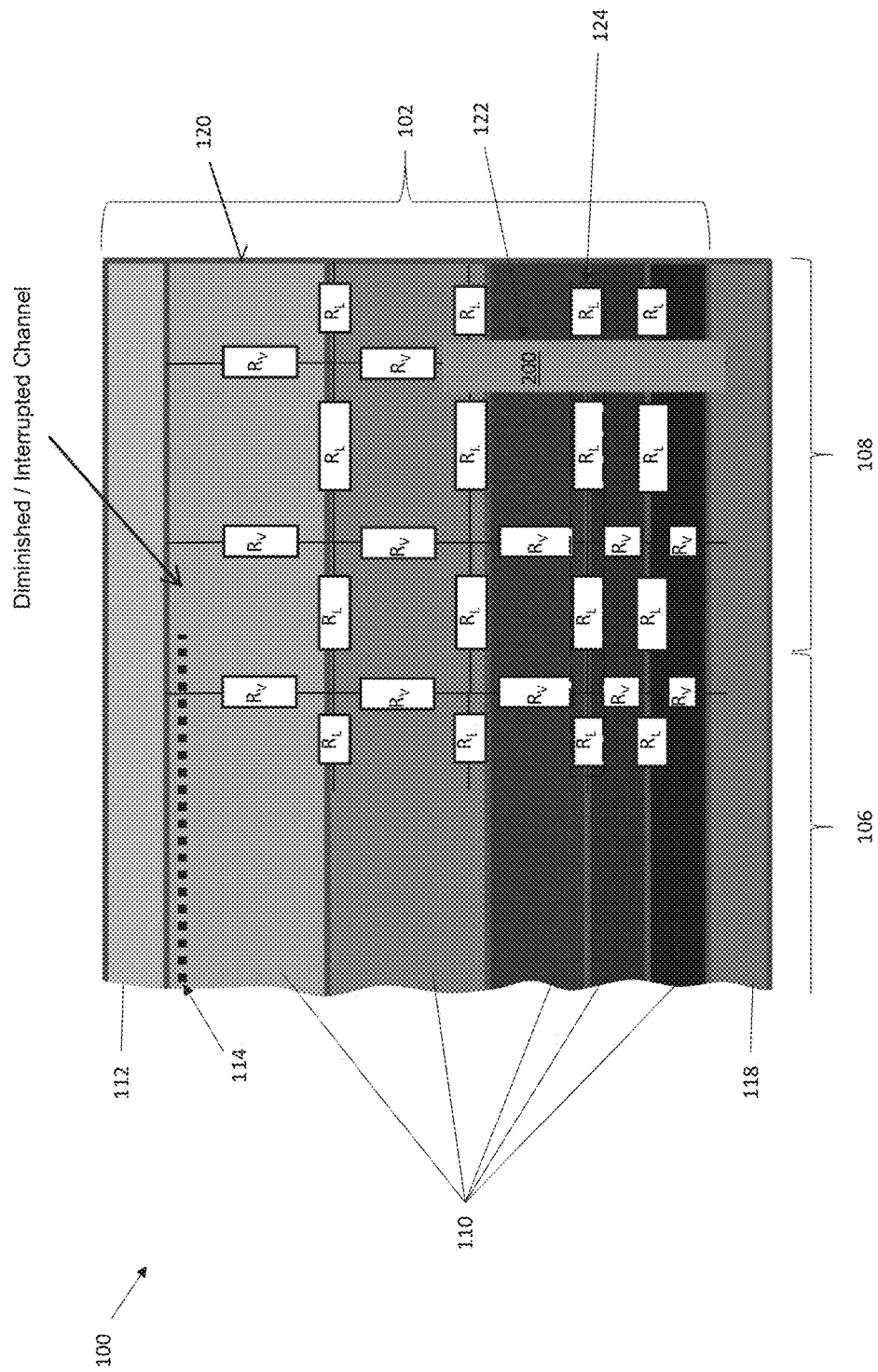
Figure 2C:
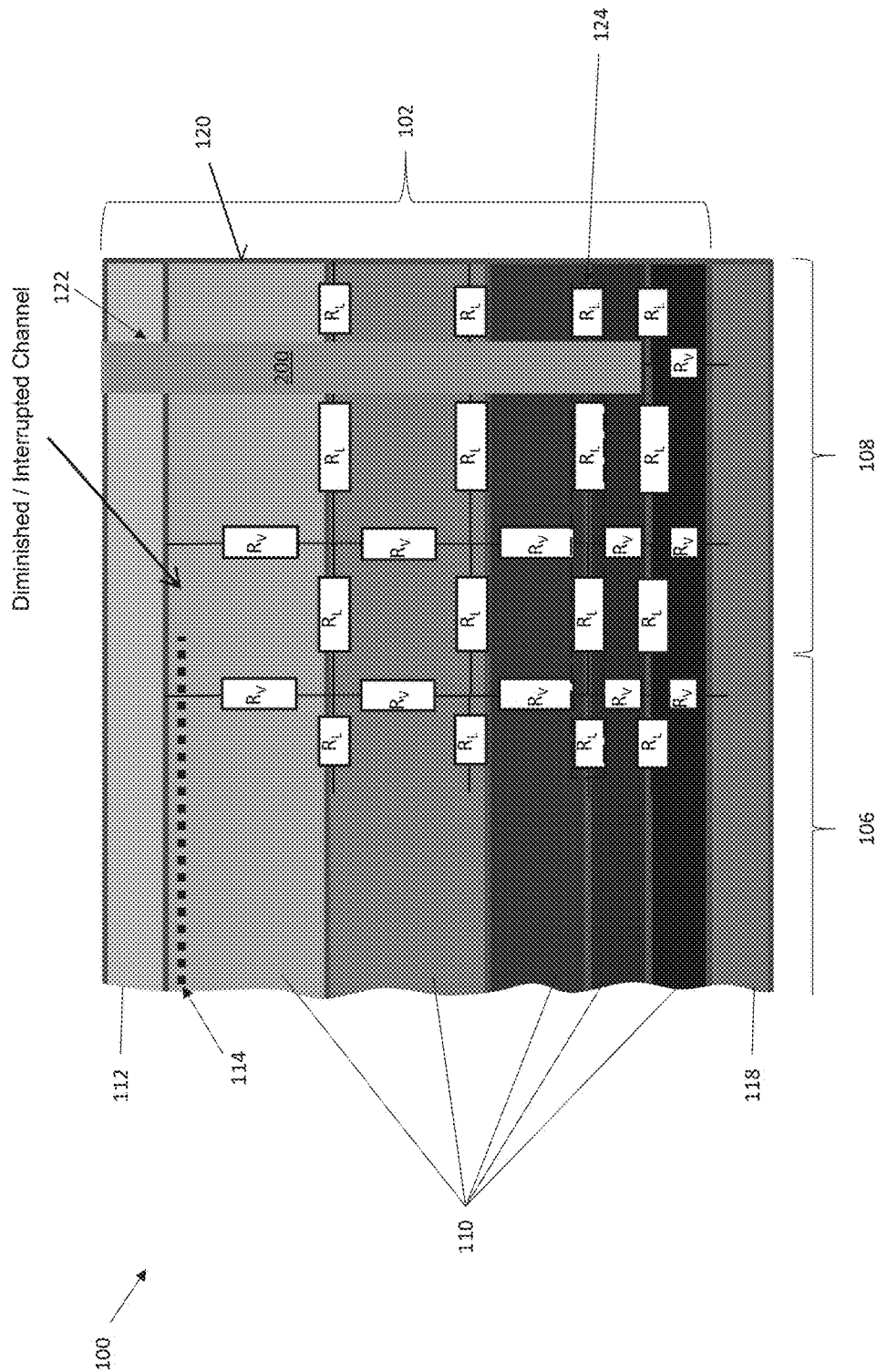

FIGS. 2A through 2O illustrate different embodiments of the III-V semiconductor die 100 shown in FIG. 1 with the uninsulated connection structure 122 implemented as an electrically conductive plug 200 which extends vertically in the periphery 108 of the semiconductor body 102 to the substrate 118, to a metallization layer (not shown in FIGS. 2A through 2C) disposed above the semiconductor body 102, or to both. The uninsulated connection structure 122 can extend completely through the periphery 108 of the semiconductor body 102 as shown in FIG. 2A so as to provide a vertical leakage path for each III-nitride layer 110 to the substrate 118 and/or a metallization layer disposed above the semiconductor body 102. Alternatively, the uninsulated connection structure 122 can extend through only part of the periphery 108 so as to provide a vertical leakage path for the lower III-nitride layers 110 to the substrate 118 as shown in FIG. 2B, or to provide a vertical leakage path for the upper III-nitride layers 110 to a metallization layer disposed above the semiconductor body 102 e.g. in the case of a non-conductive substrate 118 as shown in FIG. 2C. In each case, the electrically conductive plug 200 can be spaced apart laterally from the edge face 120 of the semiconductor die 102 by a section of the semiconductor body 102 according to the embodiments illustrated in FIGS. 2A through 2C.

Figure 3A:
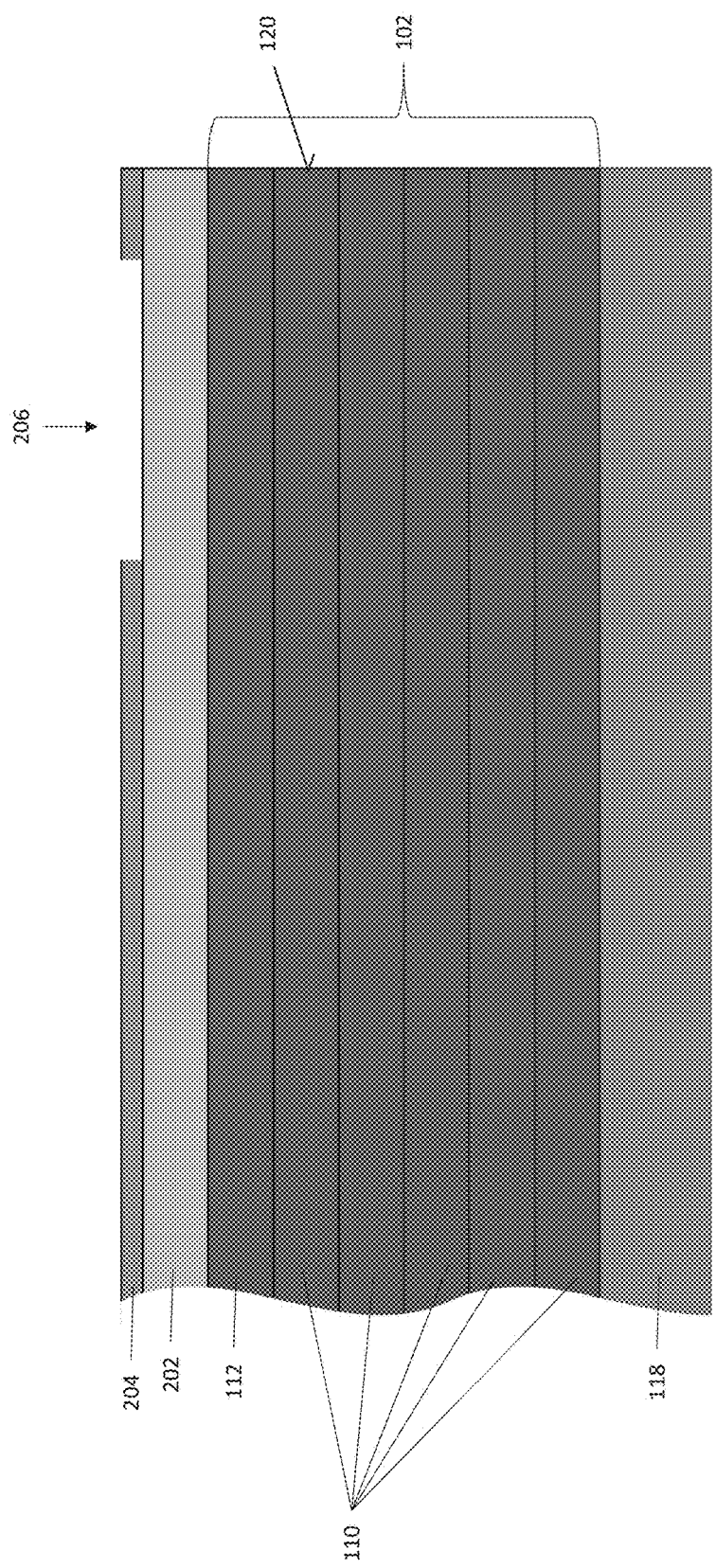
FIGS. 3A through 3C illustrate partial sectional views of the periphery of the III-V semiconductor die of FIG. 2A during different stages of an embodiment of manufacturing the intentional vertical leakage path.
Figure 3B:
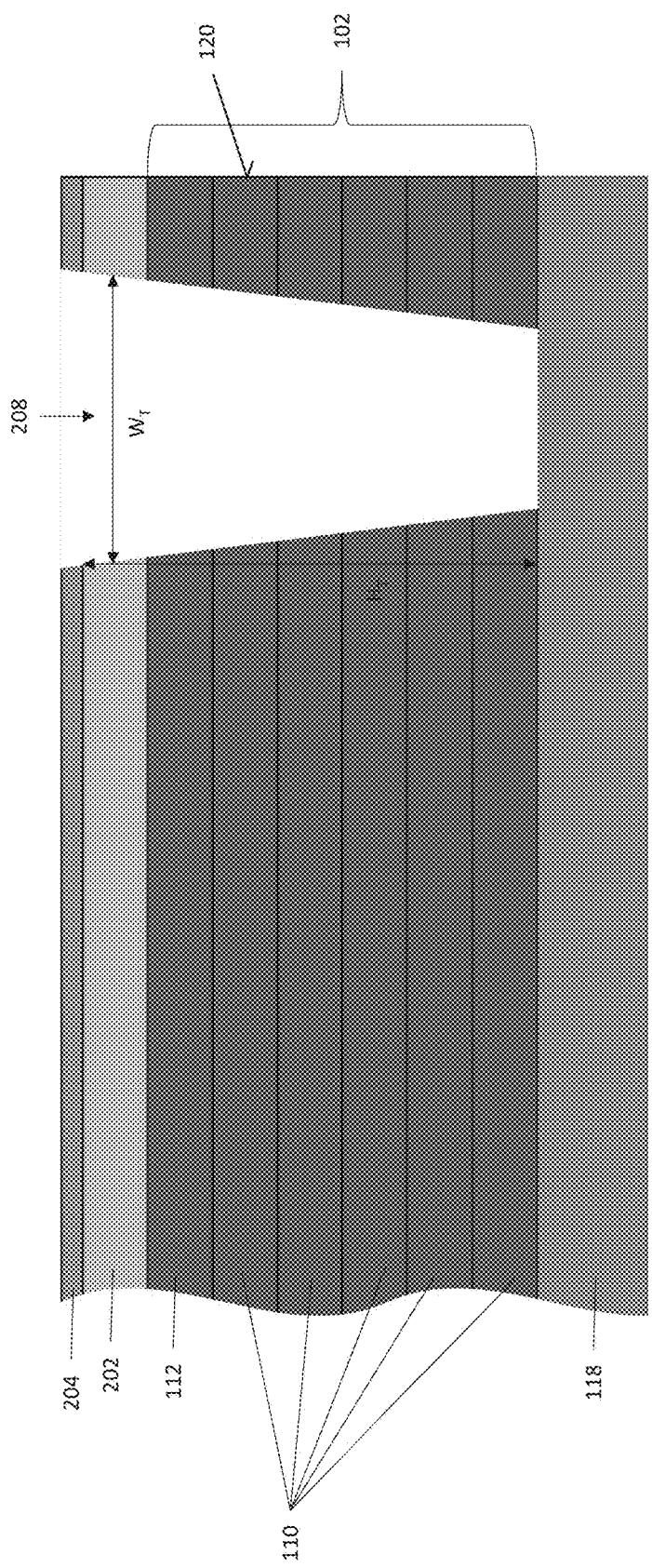
Figure 3C:
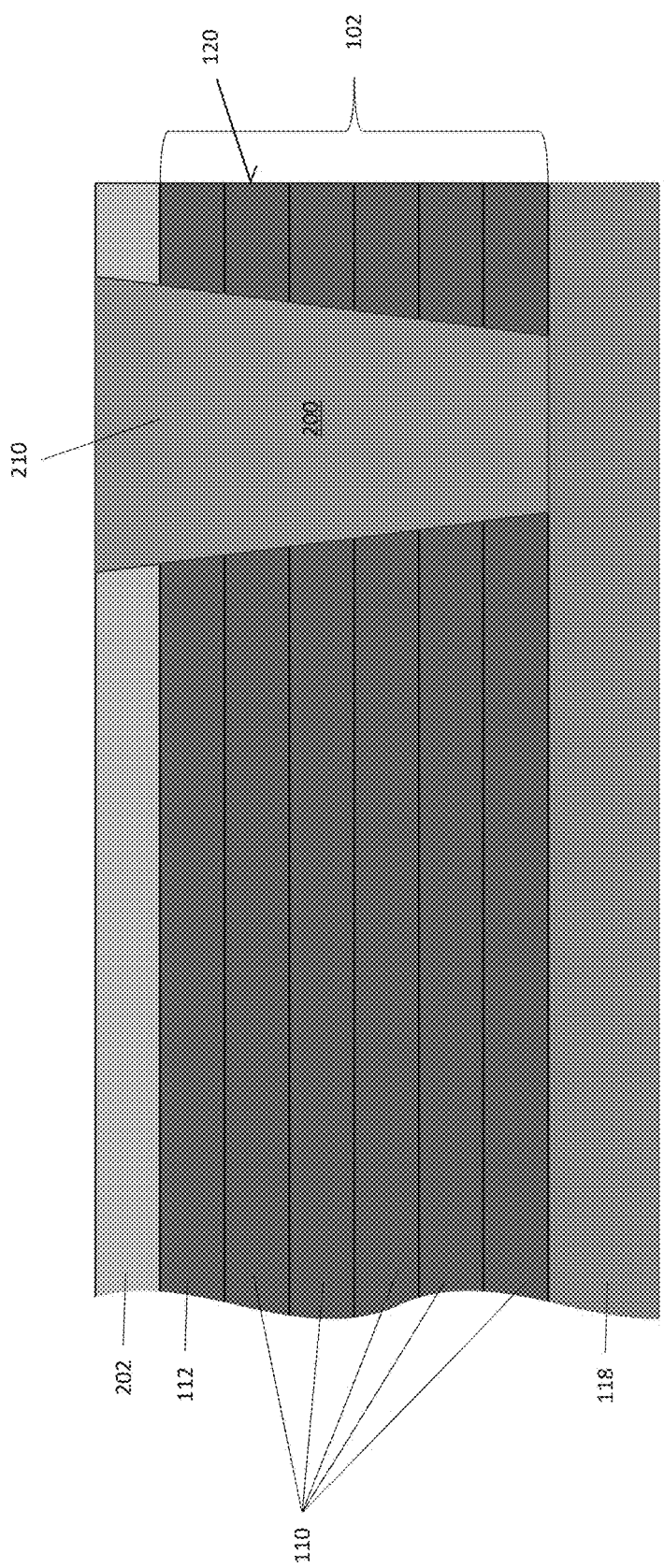

FIGS. 3A through 3C illustrate an embodiment of a method of forming the electrically conductive plug 200 shown in FIG. 2A.

FIG. 3A shows the die periphery 108 after the III-nitride semiconductor body 102 is formed, the III-barrier layer 112 is covered by an optional passivation layer 202 such as silicon nitride, and a mask 204 with an opening 206 is formed on the optional passivation layer 202. The mask 204 can be formed directly on the III-barrier layer 112 if the passivation layer 202 is omitted, or directly on the uppermost III-nitride layer 110 if the III-barrier layer 112 is removed in the die periphery 108 to disrupt the conductive channel 114.

FIG. 3B shows the die periphery 108 after a trench 208 is etched in the periphery 108 of the semiconductor body 102. The trench 208 can extend through the entire semiconductor body 102 to the substrate 118 as shown in FIG. 3B if the uninsulated connection structure 122 is to provide a vertical leakage path for each III-nitride layer 110 to the substrate 118 and/or a metallization layer (not shown in FIG. 3B) disposed above the semiconductor body 102. If the uninsulated connection structure 122 is to provide a vertical leakage path for the upper III-nitride layers 110 to a metallization layer disposed above the semiconductor body 102 or for the lower III-nitride layers 110 to the substrate 118, the trench 208 need not extend through the entire substrate 118. In each case, the etching process removes the unprotected (uncovered) portion of at least some III-nitride layers 110. If the III-nitride barrier layer 112 is present in the die periphery 108 as shown in FIG. 3B and the trench 208 is etched into the top surface of the semiconductor body 102, the trench 208 is also etched through the III-nitride barrier layer 112 in the periphery 108 of the semiconductor body 102. The trench 208 is spaced apart laterally from the edge face 120 of the die 100 by a section of the semiconductor body 102. No strict requirements are placed on the trench dimensions. For example, a high aspect ratio (significantly wider than deeper e.g. 10 times height to width ratio) trench is not required. As such, the width ($W_T$) of the trench 208 and therefore the width of the electrically conductive plug 200 to be formed in the trench 208 can range from 1 um to 20 um with a height ($H_T$) of one or more microns if the trench is etched through the entire semiconductor body 102. Any standard etching process can be used to form the trench 208. Trench etching processes are not perfectly anisotropic, and therefore the trench 208 may be narrower closer to the substrate 118 and wider further from the substrate 118 if etched into the top surface of the semiconductor body 102 as shown in FIG. 3B.

FIG. 3C shows the die periphery 108 after the mask 204 is removed and the trench 208 is filled with an electrically conductive material 210. The trench 208 can be filled with any standard electrically conductive material 210 such as a tungsten-based system, aluminum-based system, titanium-based system, etc. If the trench 208 is etched narrower closer to the substrate 118 and wider further from the substrate 118 as shown in FIG. 3B, then the electrically conductive plug 200 which fills the trench 208 also will be narrower closer to the substrate 118 and wider further from the substrate 118.

Figure 4A:
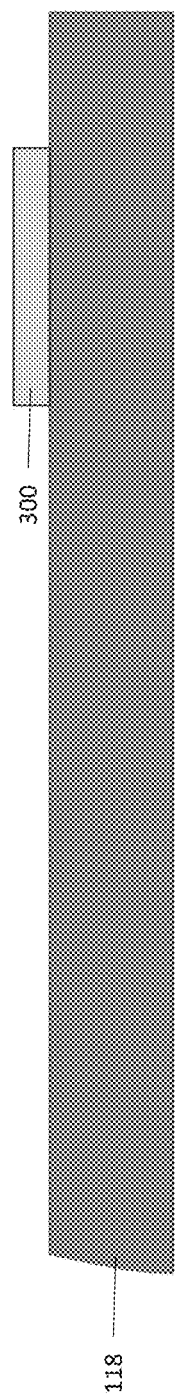
FIGS. 4A through 4C illustrate partial sectional views of the periphery of the III-V semiconductor die of FIG. 2A during different stages of another embodiment of manufacturing the intentional vertical leakage path.

FIGS. 4A through 4O illustrate another embodiment of a method of forming the electrically conductive plug 200 shown in FIG. 2A.

FIG. 4A shows the die periphery 108 after a mask 300 is formed on the substrate 118. The mask 300 is positioned where the electrically conductive plug 200 is to be formed, and comprises a material which inhibits the growth of III-nitride semiconductor material on the mask 300. For example, the mask 300 can comprise a dielectric such as silicon dioxide and/or silicon nitride.

Figure 4B:
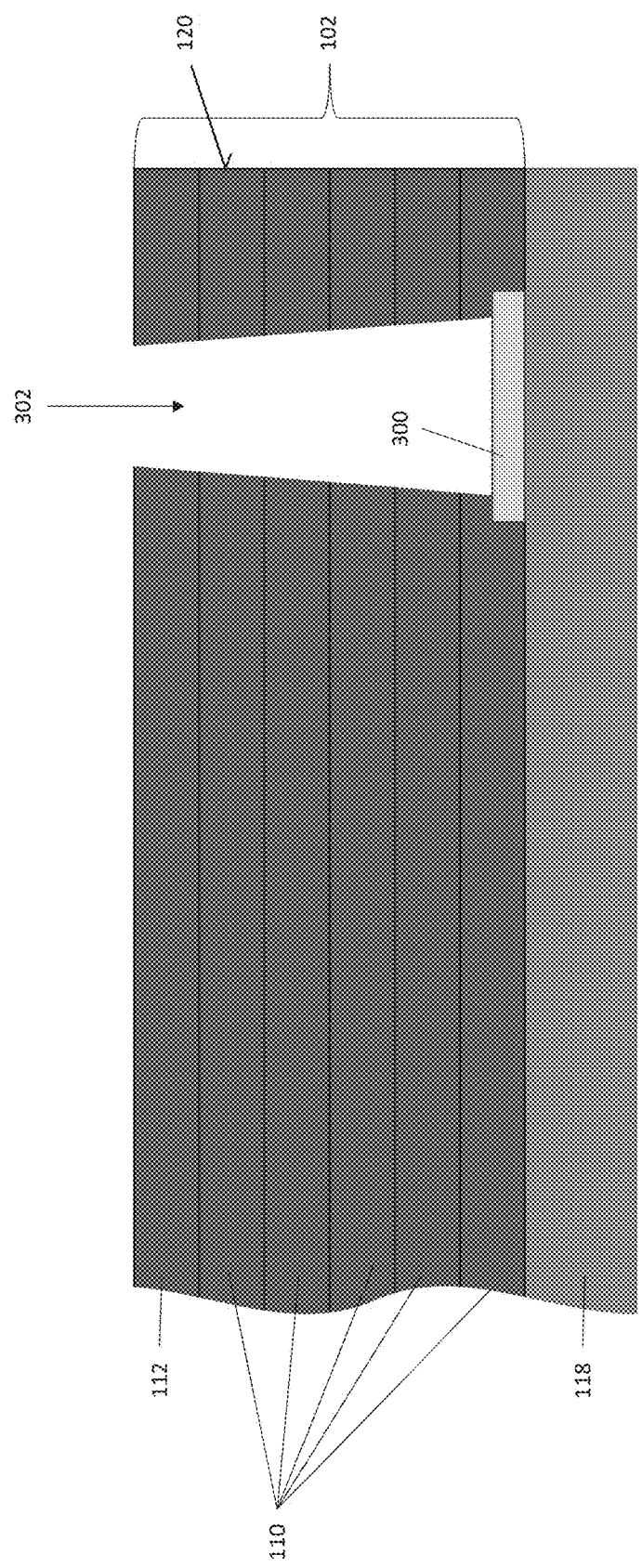

FIG. 4B shows the die periphery 108 after each III-nitride layer 110 is selectively grown on the substrate 118 and the III-nitride barrier layer 112 is selectively grown on the uppermost III-nitride layer 110. Any standard selective epitaxy process can be used to form the stack of III-nitride layers 110/112. The growth process is selective to the mask 300 in that little to no overgrowth occurs on the mask 300 so as to form a void 302 in the semiconductor body 102 which exposes at least some of the mask 300. Some lateral overgrowth may occur as shown in FIG. 4B, especially for total stack thicknesses of 1 micron or greater. In this case, the void 302 and therefore the electrically conductive plug 200 to be formed in the void 302 will be wider closer to the substrate 118 and narrower further from the substrate 118.

Figure 4C:
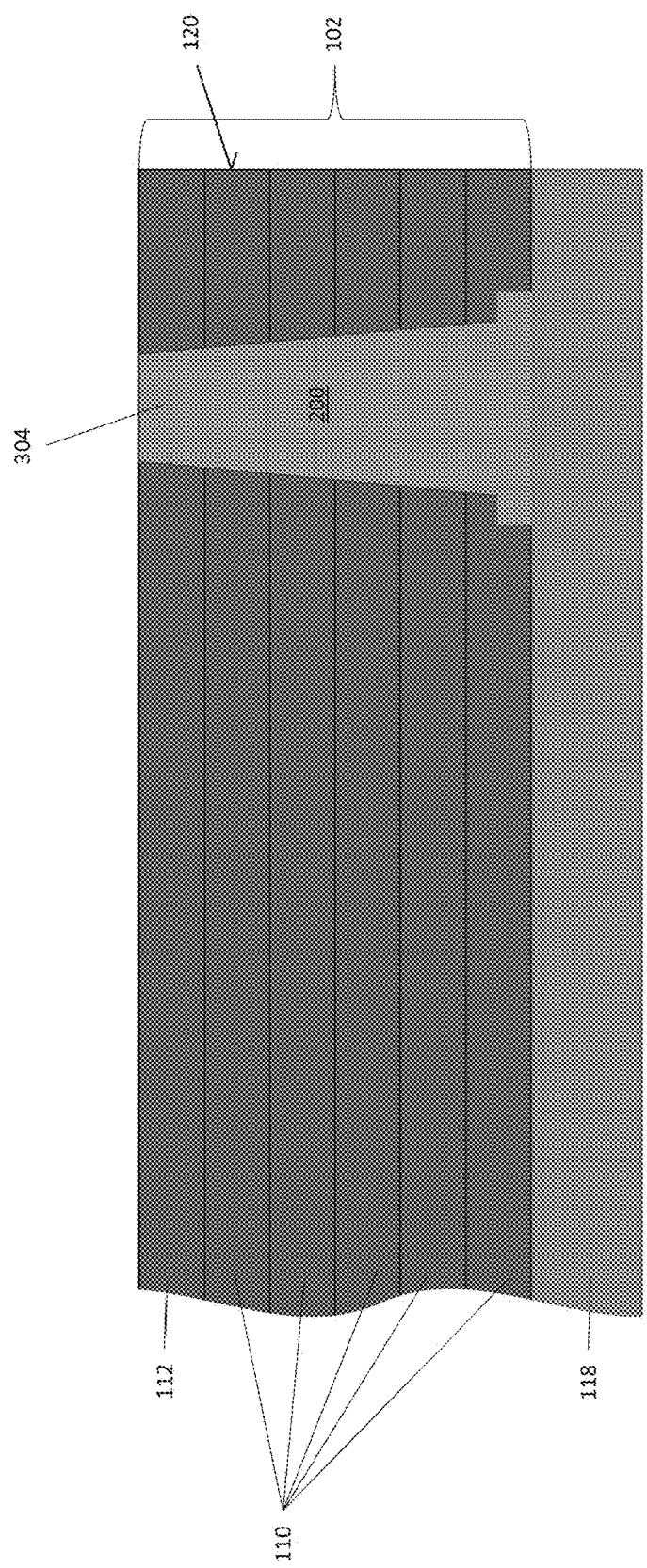

FIG. 4C shows the die periphery 108 after the mask 300 is removed and the void 302 is filled with an electrically conductive material 304. As explained above, no strict requirements are necessarily placed on the dimensions of the electrically conductive plug 200. As such, the void 302 in the III-nitride layer stack 110/112 can be filled with any standard electrically conductive material 304 such as a tungsten-based system, aluminum-based system, titanium-based system, etc.

The electrically conductive plug 200 shown in FIGS. 2-4 can electrically connect each III-nitride layer 110 and the III-nitride barrier layer 112 if present in the die periphery 108 to a metallization layer above the semiconductor body 102. The metallization layer can include one or more contact pads for providing electrical connections to the die. One or more of the contact pads (e.g. the source pad) and the substrate 118 can be at the same electric potential e.g. source or drain potential.

Figure 5:
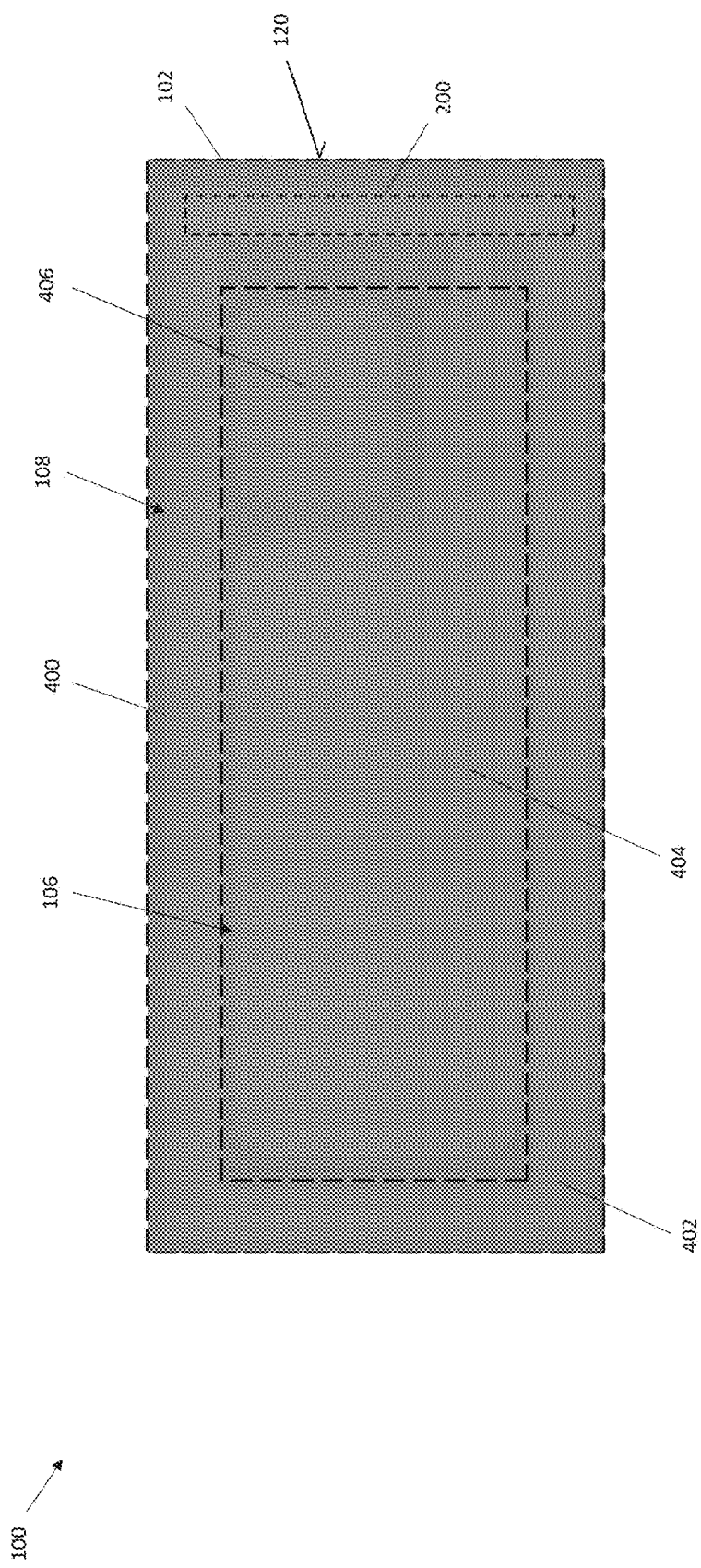
FIG. 5 illustrates a top plan view of the III-V semiconductor die of FIGS. 2A through 2O.

FIG. 5 illustrates a top plan view of the semiconductor die 100 shown in FIGS. 2A through 2C, with the electrically conductive plug 200 being electrically connected to a metallization layer 400 disposed above the semiconductor body 102. This way, the edge face 120 of the die 100 can be tied to drain or source potential.

The die 100 has a periphery region 108 indicated by the dashed box which is devoid of active devices as previously explained herein. In some cases, a seal ring structure 402 formed in the metallization layer 400 surrounds the active area 106 of the semiconductor body 102. The seal ring structure 402 is designed to prevent crack propagation and can prevent humidity from reaching the inner part of the die 100. The electrically conductive plug 200 can extend vertically to the metallization layer 402, and form part of the seal ring structure 402 as shown in FIG. 5 if the seal ring structure 402 is provided. The electrically conductive plug 200 is out of view in FIG. 5 and therefore illustrated as a dashed box. The electrically conductive plug 200 can be disposed at one side of the die 100 as shown in FIG. 5, can be disposed at more than one side, or can surround the active area 106 of the die 100 e.g. by following the same outline of the seal ring structure 402 if provided. In each case, the electrically conductive plug 200 can be electrically connected to a contact pad 404 formed in the metallization layer 400 above the semiconductor body 102. The contact pad 404 can be a drain or source contact pad, depending on the design of the die 100. One or more additional contact pads such as a gate contact pad 406 for the gate of the device can be formed at this side of the die 100 in the metallization layer 400. The additional contact pads are electrically isolated from the electrically conductive plug 200.

Figure 6A:
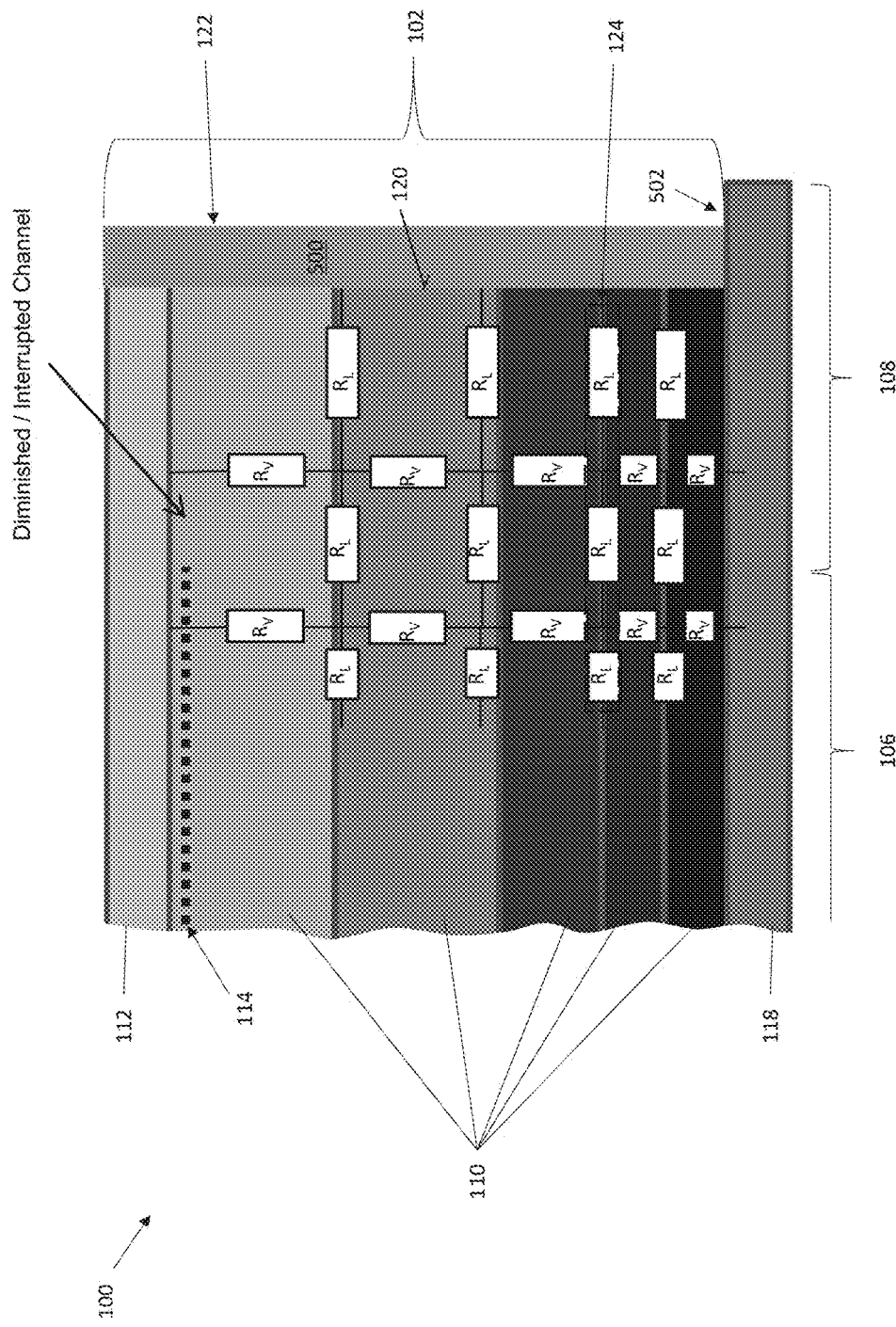
FIGS. 6A through 6C illustrates respective partial sectional views of the III-V semiconductor die of FIG. 1 according to different second embodiments of the intentional vertical leakage path.
Figure 6B:
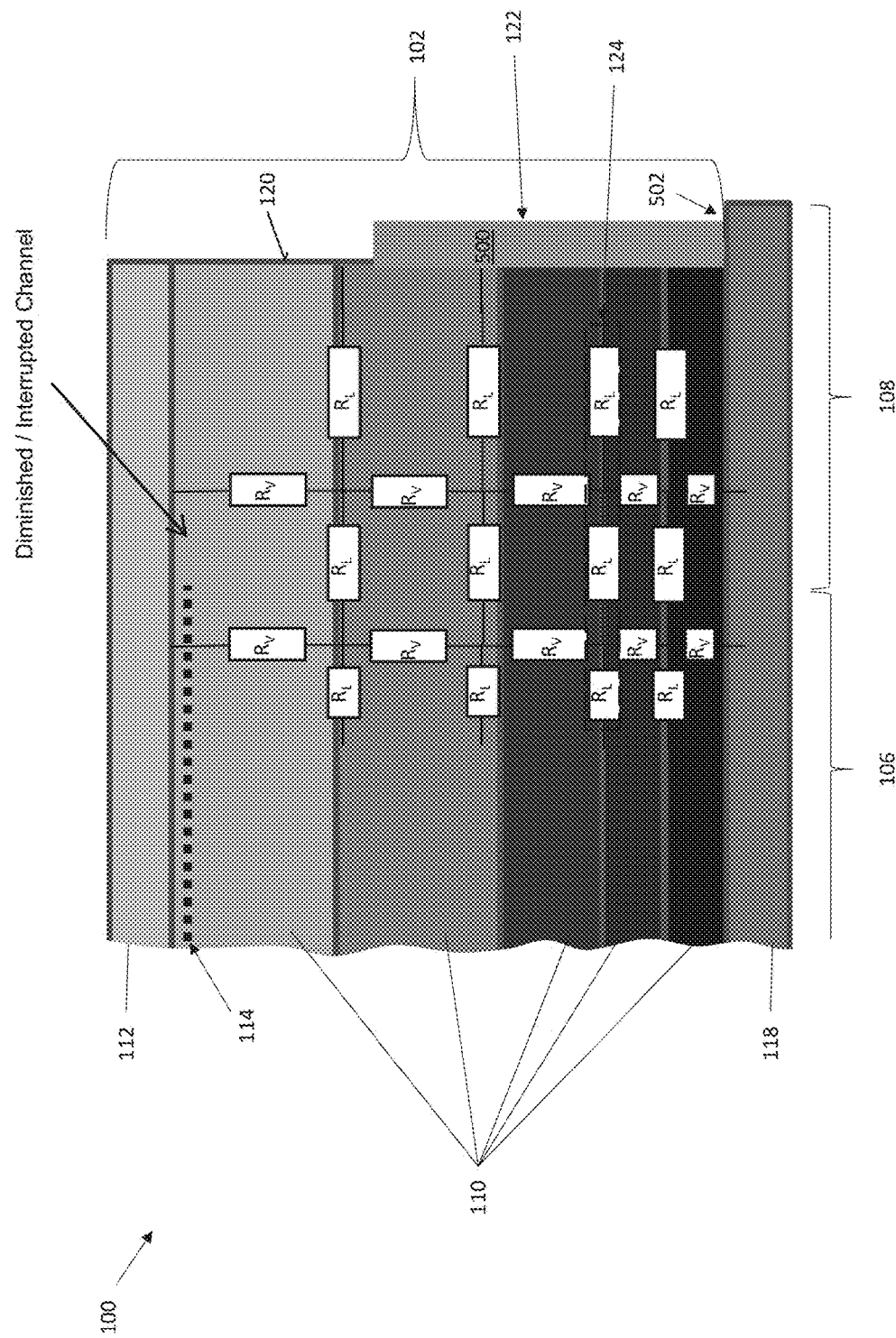
Figure 6C:
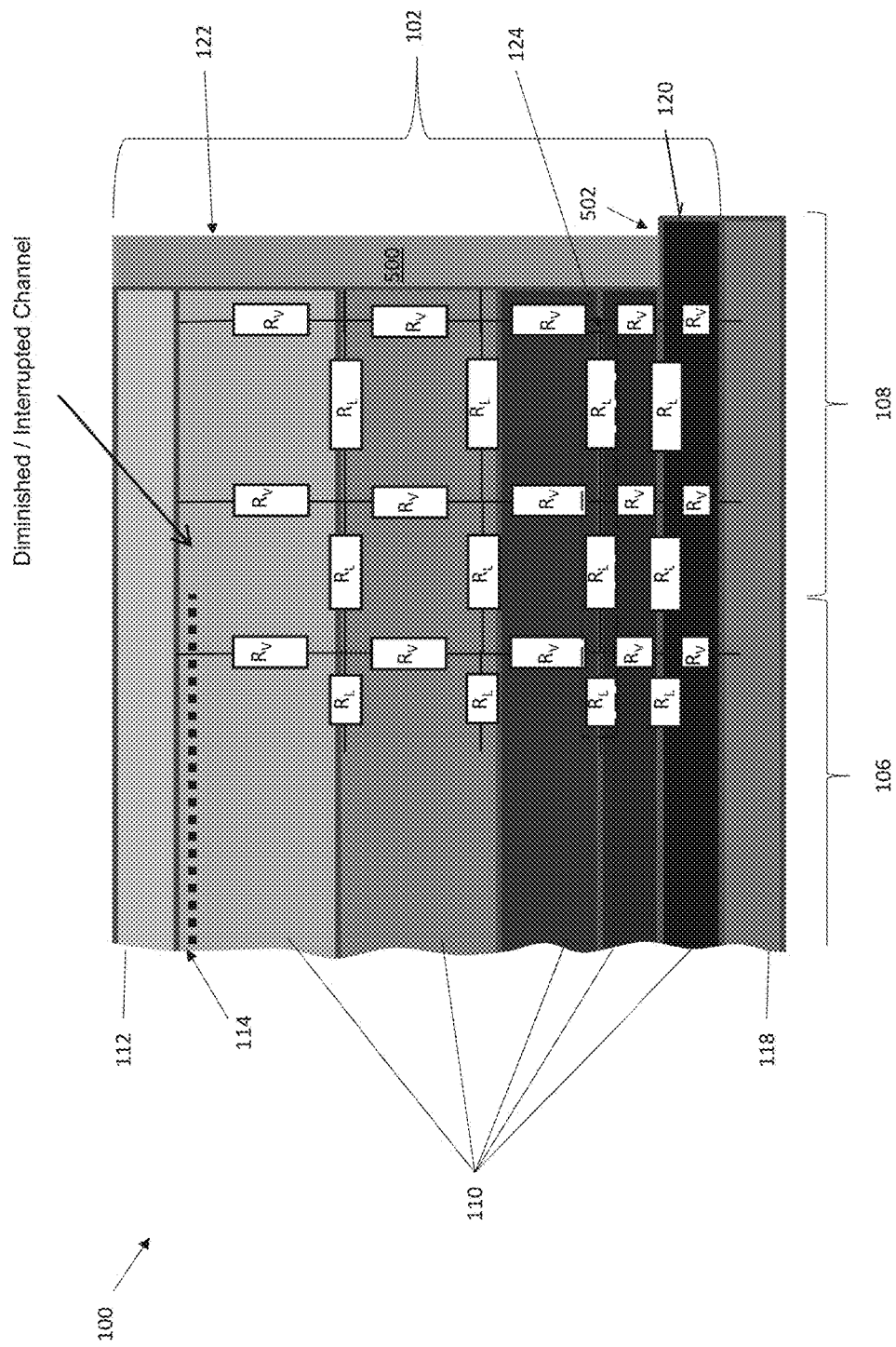

FIGS. 6A through 6C illustrate different embodiments of the III-V semiconductor die 100 shown in FIG. 1 with the uninsulated connection structure 122 implemented as an electrically conductive layer 500 disposed vertically along at least part of the edge face 120 of the die 100 and onto a step 502. The step 502 can occur at the edge face 120 of the semiconductor die 100 between the substrate 118 and the III-nitride semiconductor body 102 as shown in FIGS. 6A and 68, or between two adjacent ones of the III-nitride layers 110 or in one of the III-nitride layers 110 as shown in FIG. 6C, so that the substrate 118 or one or more of the III-nitride layers 110 extends outward at the edge face 120. The electrically conductive layer 500 can vertically extend along the entire edge face 120 of the semiconductor die 100 and onto the step 502 as shown in FIG. 6A so as to provide a vertical leakage path for each III-nitride layer 110 to the substrate 118 and/or a metallization layer (not shown in FIGS. 6A through 6C) disposed above the semiconductor body 102. Alternatively, the electrically conductive layer 500 can vertically extend along only the lower part of the edge face 120 and onto the step 502 so as to provide a vertical leakage path for the lower III-nitride layers 110 to the substrate 118 e.g. in the case of an electrically conductive substrate 118 as shown in FIG. 6B, or vertically extend along only the upper part of the edge face 120 and onto the step 502 so as to provide a vertical leakage path for the upper III-nitride layers 110 to a metallization layer disposed above the semiconductor body 102 e.g. in the case of a non-conductive substrate 118 as shown in FIG. 6C.

Figure 7A:
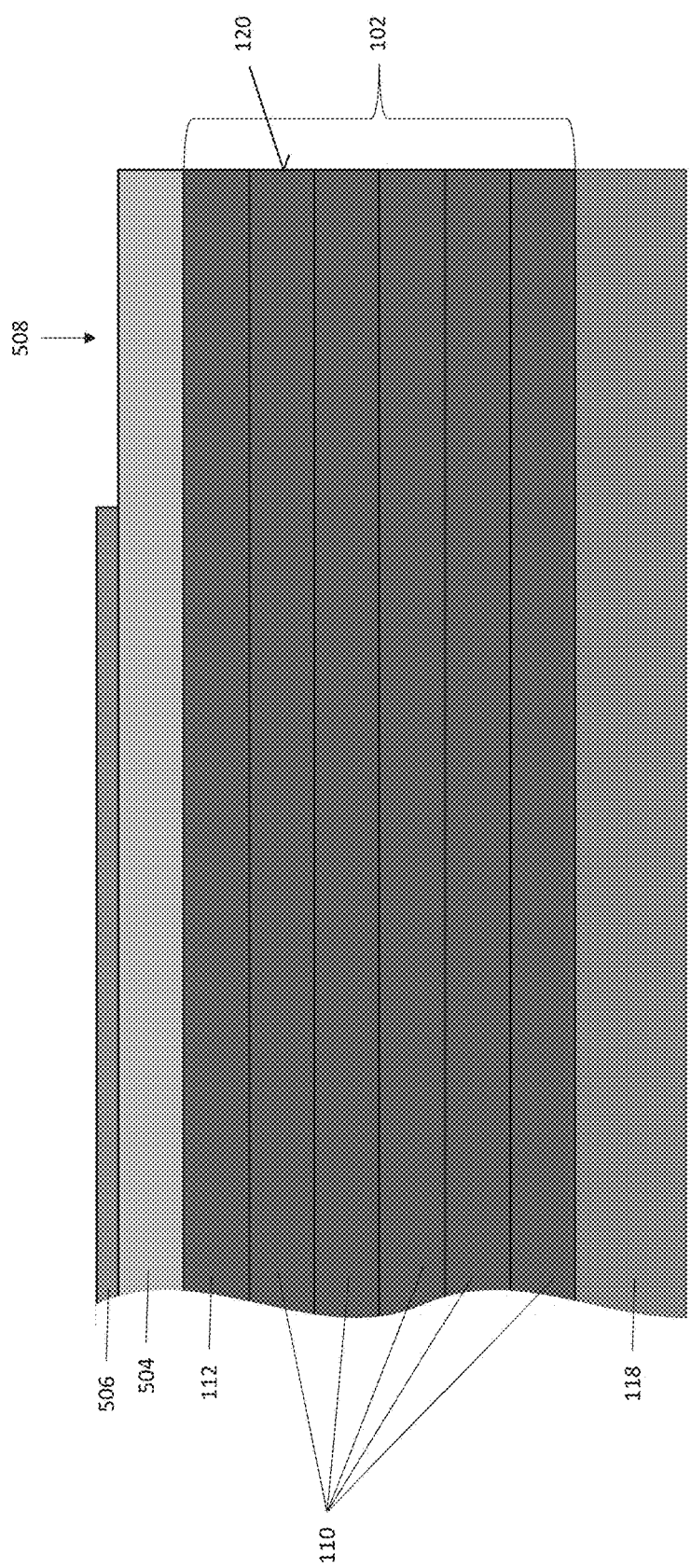
FIGS. 7A through 7C illustrate partial sectional views of the periphery of the III-V semiconductor die of FIG. 6A during different stages of an embodiment of manufacturing the intentional vertical leakage path.
Figure 7B:
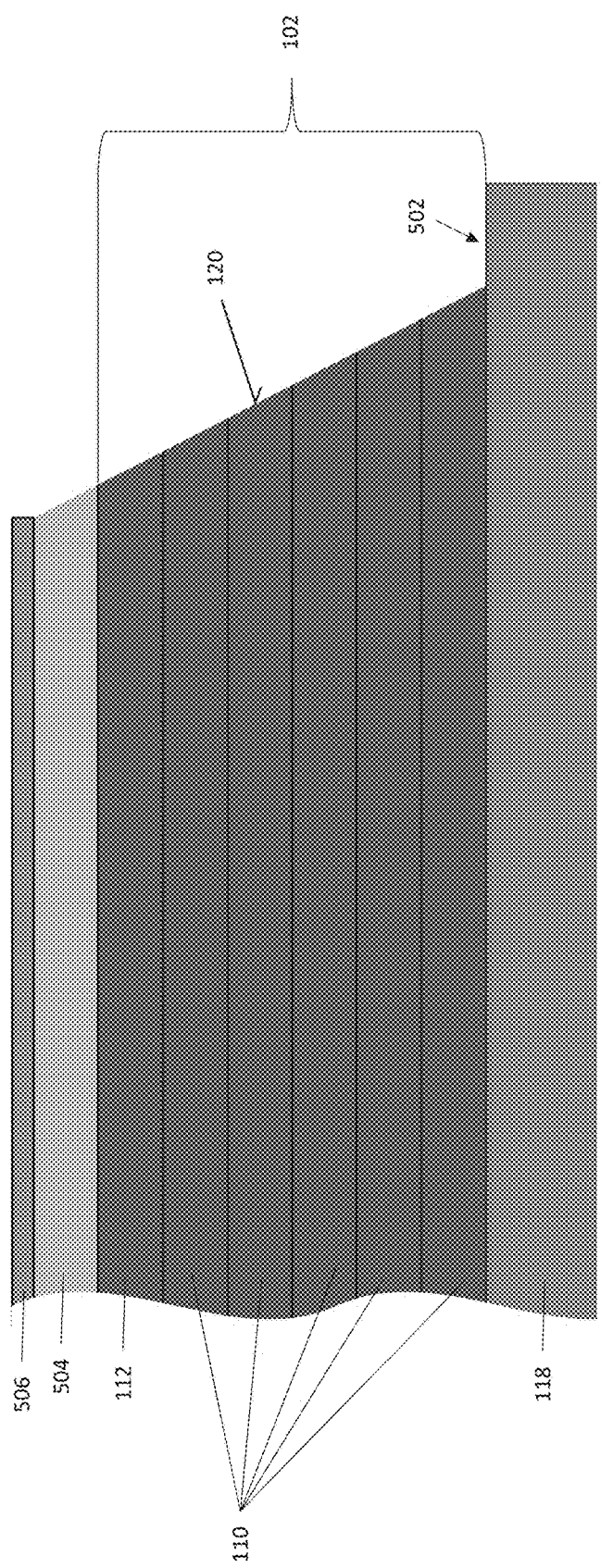
Figure 7C:
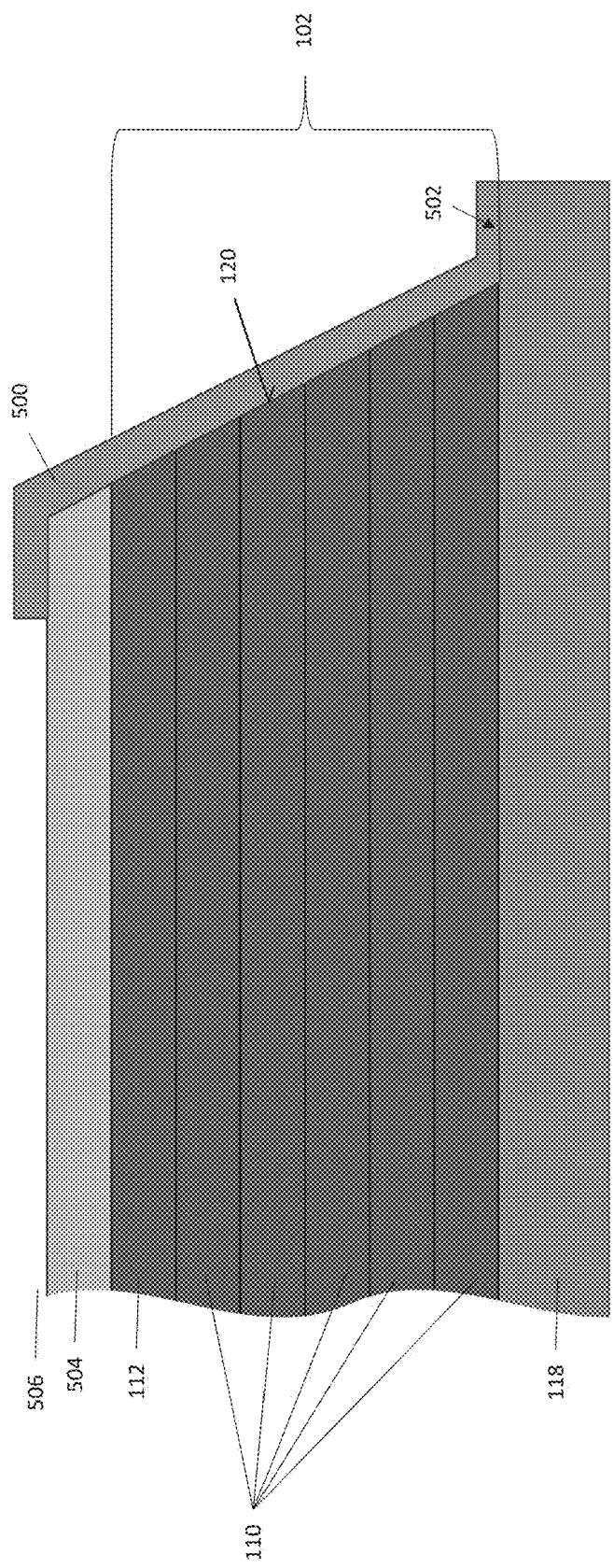

FIGS. 7A through 7C illustrate an embodiment of a method of forming the vertically extending electrically conductive layer 500 shown in FIG. 6A.

FIG. 7A shows the die periphery 108 after the III-nitride semiconductor body 102 is formed, the III-barrier layer 112 is covered by an optional passivation layer 504 such as silicon nitride, and a mask 506 with an opening 508 is formed on the optional passivation layer 504. The mask 506 can be formed directly on the III-barrier layer 112 if the passivation layer 504 is omitted, or directly on the uppermost III-nitride layer 110 if the III-barrier layer 112 is removed in the die periphery 108 to disrupt the conductive channel 114.

FIG. 7B shows the die periphery 108 after the III-nitride semiconductor body 102 and optional passivation layer 504 is etched in the periphery 108 of the semiconductor body 102. The etching process removes the unprotected (uncovered) portion of each layer 110/112/504, exposing part of the underlying substrate 118 as shown in FIG. 7B if the electrically conductive layer 500 is to provide a vertical leakage path for each III-nitride layer 110 to the substrate 118 and/or a metallization layer (not shown in FIG. 7B) disposed above the semiconductor body 102. If the electrically conductive layer 500 is to provide a vertical leakage path for the upper III-nitride layers 110 to a metallization layer disposed above the semiconductor body 102 or for the lower III-nitride layers 110 to the substrate 118, the etching process can stop before the substrate 118 is reached. In each case, a step 502 is formed at the edge face 120 of the semiconductor die 100 between the substrate 118 and the III-nitride semiconductor body 102 as shown in FIG. 7B or between two adjacent III-nitride layers 110 or in one of the III-nitride layers 110 if the etching process stops before reaching the substrate 118, so that the substrate 118 or one or more of the III-nitride layers 110 extends outward further than the remainder of the semiconductor body 102 at the edge face 120. Any standard etching process can be used to form the step 502, which can result in over-etch of the substrate 118 if the entire semiconductor body 102 is etched through.

FIG. 7C shows the die periphery 108 after an electrically conductive layer 500 is deposited on the edge face 120 and the step 502. The edge face 120 of the die 100 may be sloped/angled as a result of the etching process. If the slope/angle of the etched edge face 120 is not too step, any standard metal deposition process can be used to form the electrically conductive layer 500. In the case of a standard conformal deposition process, the electrically conductive layer 500 can have a thickness in a range of 200 nm to 300 nm.

If the slope/angle of the etched edge face 120 of the die 100 is so step such that standard conformal deposition processes may result in voids/breaks in the electrically conductive layer 500, a standard furnace deposition process instead can be used to avoid such breaks/voids. The electrically conductive layer 500 can be formed from any standard electrically conductive material such as a tungsten-based system, aluminum-based system, titanium-based system, etc. In some cases, a corrosive-resistant material can be used since the electrically conductive layer 500 is disposed along the exposed edge face 120 of the III-nitride semiconductor body 102 and therefore may be directly subjected to harsh environmental conditions.

Figure 8:
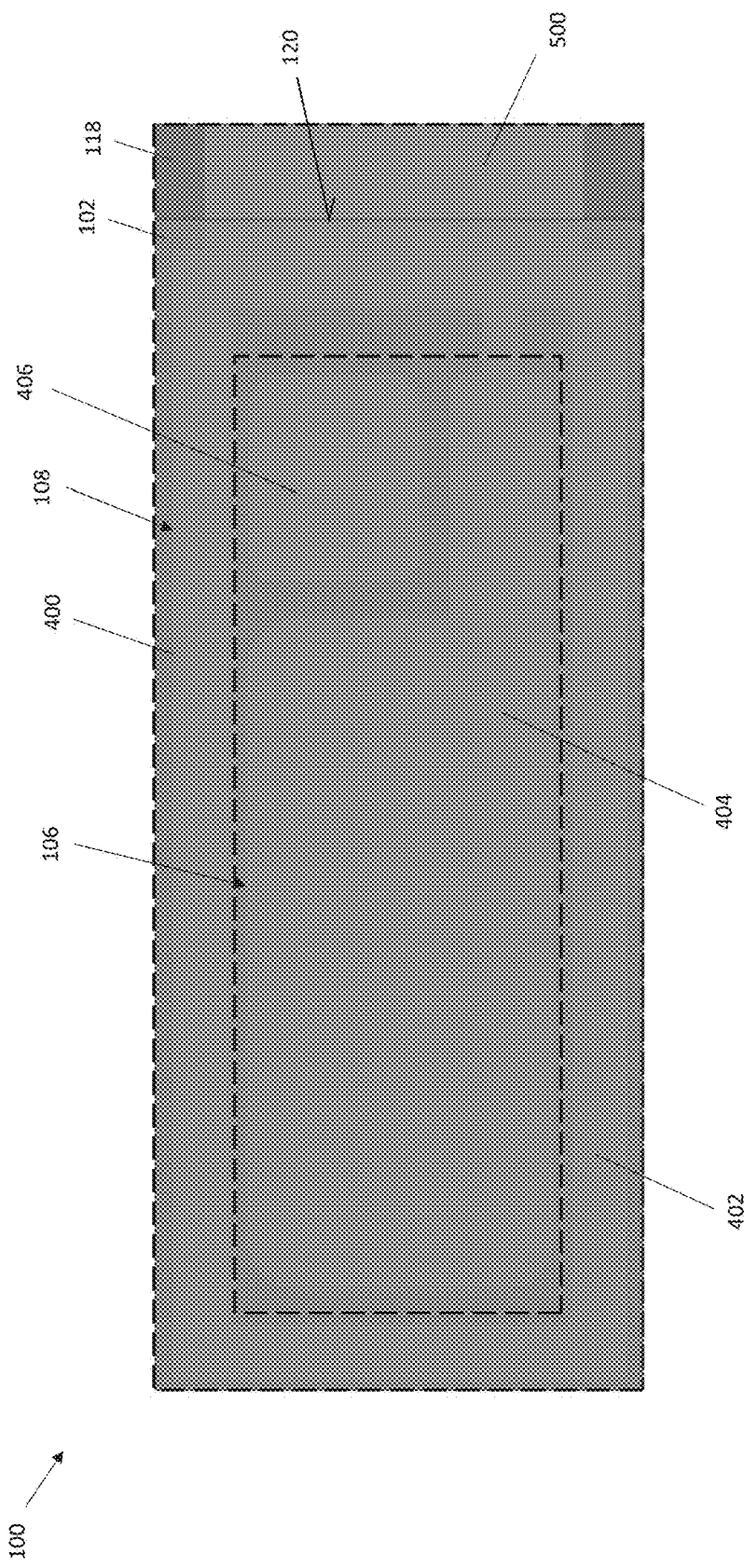
FIG. 8 illustrates a top plan view of the III-V semiconductor die of FIGS. 6A through 6C.

FIG. 8 illustrates a top plan view of the semiconductor die shown in FIGS. 6A through 6C, with the vertically extending electrically conductive layer 500 being electrically connected to a metallization layer 400 disposed above the semiconductor body 102. This way, the edge face 120 of the die 100 can be tied to drain or source potential. The electrically conductive layer 500 can be disposed at one side of the die 100 as shown in FIG. 8, can be disposed at more than one side, or can surround the active area 106 of the die 100 e.g. by following the same outline of the seal ring structure 402 if provided in the metallization layer 400 as previously described herein in connection with FIG. 5.

The vertically extending electrically conductive layer 500, which forms the uninsulated connection structure 122 in this embodiment, can be electrically connected to a contact pad 404 formed in the metallization layer 400 above the semiconductor body 102 also as previously described herein. The contact pad 404 can be a drain or source contact pad, depending on the design of the die 100. One or more additional contact pads such as a gate contact pad 406 for the gate of the device can be formed at this side of the die 100 in the metallization layer 400. The additional contact pads are electrically isolated from the vertically extending electrically conductive layer 500.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a semiconductor die, the method comprising:
   forming a semiconductor body on a substrate, the semiconductor body having a periphery which is devoid of active devices and terminates at an edge face of the semiconductor die, the semiconductor body comprising a first III-nitride semiconductor layer and a plurality of second III-nitride semiconductor layers below the first III-nitride semiconductor layer; and
   forming an uninsulated connection structure which extends vertically in the periphery of the semiconductor body and provides a vertical leakage path for at least some of the second III-nitride semiconductor layers either to the substrate or to a metallization layer disposed above the semiconductor body, but not to both.

2. The method of claim 1, wherein forming the uninsulated connection structure comprises:
   forming an electrically conductive plug which extends vertically in the periphery of the semiconductor body to the substrate, or to the metallization layer disposed above the substrate.

3. The method of claim 2, wherein forming the electrically conductive plug comprises:
   etching a trench in the periphery of the semiconductor body which extends towards the substrate; and
   filling the trench with an electrically conductive material.

4. The method of claim 3, wherein the trench is etched through the first III-nitride semiconductor layer and through each of the second III-nitride semiconductor layers in the periphery of the semiconductor body.

5. The method of claim 3, wherein the trench is etched in the periphery of the semiconductor body so that the trench is spaced apart laterally from the edge face of the semiconductor die by a section of the semiconductor body.

6. The method of claim 3, wherein the trench is narrower closer to the substrate and wider further from the substrate.

7. The method of claim 2, wherein forming the electrically conductive plug comprises:
   forming a mask on the substrate;
   selectively growing the first III-nitride semiconductor layer and each of the second III-nitride semiconductor layers so as to form a void in the semiconductor body which exposes at least some of the mask; and
   filling the void with an electrically conductive material.

8. The method of claim 7, wherein the void is wider closer to the substrate and narrower further from the substrate.

9. The method of claim 1, wherein forming the uninsulated connection structure comprises:
   forming a step at the edge face of the semiconductor die between the substrate and the semiconductor body or between two adjacent ones of the second III-nitride semiconductor layers or in one of the second III-nitride semiconductor layers; and
   depositing an electrically conductive layer on at least part of the edge face and the step.

10. The method of claim 1, wherein the uninsulated connection structure has a resistivity of less than 1 megaohm*cm$^2$.

11. The method of claim 1, wherein the uninsulated connection structure extends to the metallization layer.

12. The method of claim 11, wherein the uninsulated connection structure extends only partially through the plurality of second III-nitride semiconductor layers, whereby the uninsulated connection structure does not extend through each of the second III-nitride semiconductor layers.

13. The method of claim 1, wherein the uninsulated connection structure extends to the substrate.

14. The method of claim 13, wherein the uninsulated connection structure extends only partially through the plurality of second III-nitride semiconductor layers, whereby the uninsulated connection structure does not extend through each of the second III-nitride semiconductor layers.

15. The method of claim 1, wherein forming the uninsulated connection structure comprises:
   forming a lower portion of the uninsulated connection structure, the lower portion having a lateral planar face; and
   forming an upper portion of the uninsulated connection structure, the upper portion having an outer bounding face located directly above the lower portion,
   wherein the lateral planar face of the lower portion is not parallel to the outer bounding face of the upper portion.

16. A method of manufacturing a semiconductor die, the method comprising:
   forming a semiconductor body supported by a substrate and having a periphery which is devoid of active devices and terminates at an edge face of the semiconductor die, the semiconductor body comprising a first III-nitride semiconductor layer and a plurality of second III-nitride semiconductor layers below the first III-nitride semiconductor layer;

forming a seal ring structure formed in a metallization layer disposed above the substrate, the seal ring structure surrounding an active area of the semiconductor body; and forming an uninsulated connection structure forming part of the seal ring structure and extending vertically in the periphery of the semiconductor body to provide a vertical leakage path for at least some of the second III-nitride semiconductor layers to the metallization layer.

17. The method of claim 16, wherein the seal ring structure and the uninsulated connection structure completely surround the active area of the semiconductor body.

18. The method of claim 16, wherein forming the uninsulated connection structure comprises:

forming an electrically conductive plug which extends vertically in the periphery of the semiconductor body to the substrate, to the metallization layer disposed above the substrate, or to both the substrate and the metallization layer.

19. The method of claim 18, wherein the electrically conductive plug follows a same outline of the seal ring structure to surround the active area of the semiconductor body.

20. A method of manufacturing a semiconductor die, the method comprising:

forming a semiconductor body supported by a substrate and having a periphery which is devoid of active devices and terminates at an edge face of the semiconductor die, the semiconductor body comprising a first III-nitride semiconductor layer and a plurality of second III-nitride semiconductor layers below the first III-nitride semiconductor layer;

forming an uninsulated connection structure which extends vertically in the periphery of the semiconductor body and provides a vertical leakage path for at least some of the second III-nitride semiconductor layers either to the substrate or to a metallization layer disposed above the semiconductor body, but not to both; and forming a step between two adjacent ones of the second III-nitride semiconductor layers, wherein the uninsulated connection structure comprises an electrically conductive layer disposed along at least part of the edge face and onto the step.

* * * * *